United States Patent [19]
Romerein

[11] Patent Number: 5,796,316
[45] Date of Patent: *Aug. 18, 1998

[54] TOP EXIT COUPLER

[75] Inventor: Robert L. Romerein, Lindsay, Canada

[73] Assignee: J.E. Thomas-Specialties Limited, Lindsay, Canada

[*] Notice: The term of this patent shall not extend beyond the expiration date of Pat. No. 5,675,300.

[21] Appl. No.: 864,961

[22] Filed: May 29, 1997

Related U.S. Application Data

[63] Continuation of Ser. No. 633,527, Apr. 17, 1996, Pat. No. 5,675,300.

[30] Foreign Application Priority Data

Oct. 18, 1995 [CA] Canada ................... 2160854

[51] Int. Cl.$^6$ ............................................. H03H 7/48
[52] U.S. Cl. ................... 333/100; 333/112; 333/128
[58] Field of Search ........................ 333/100, 109, 333/112, 116, 119, 124, 127, 128, 136, 24 R; 361/736, 752, 758, 784, 814; 455/3.1, 6.1, 6.2

[56] References Cited

U.S. PATENT DOCUMENTS 5,058,198 10/1991 Rocci et al. ................... 333/109 X

*Primary Examiner*—Paul Gensler

[57] ABSTRACT

In a CATV housing:the main RF circuit, a coupler circuit and splitter circuit are located respectively on a platform board, coupler board and splitter board respectively. The coupler board is between and perpendicular to the platform board attached to the housing and to the splitter board attached to the lid. The coupler circuit has a main RF circuit input and output near the bottom of the coupler board and a tap output to the splitter at the top of the board. A ground plane on the coupler board approximates, relative to the coupler circuitry, transmission line impedance. In combination with ground planes on the platform board and splitter board, the ground planes provide approximate transmission line impedance to both the main RF path and to the path through the coupler to the splitter output.

20 Claims, 9 Drawing Sheets

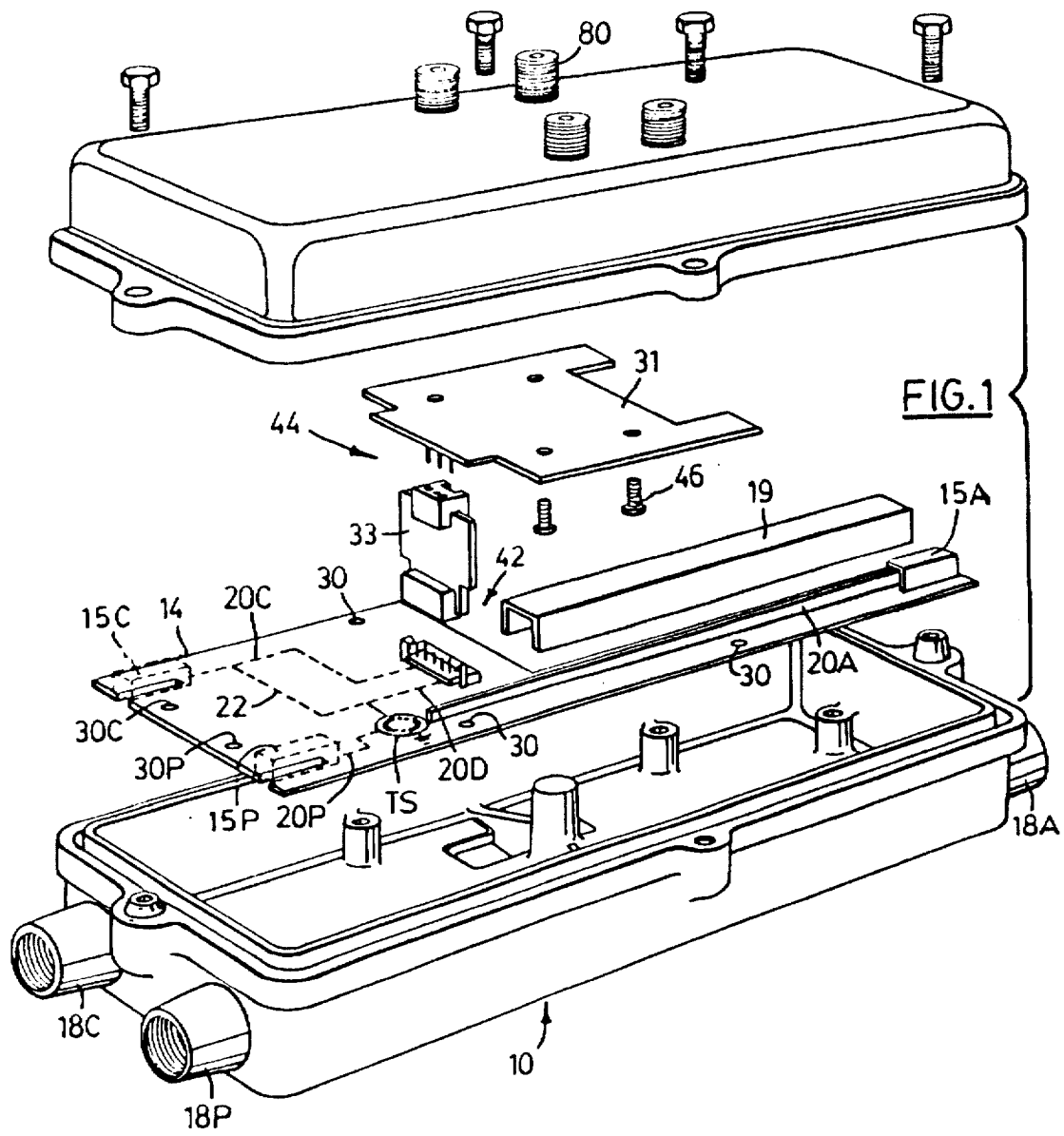

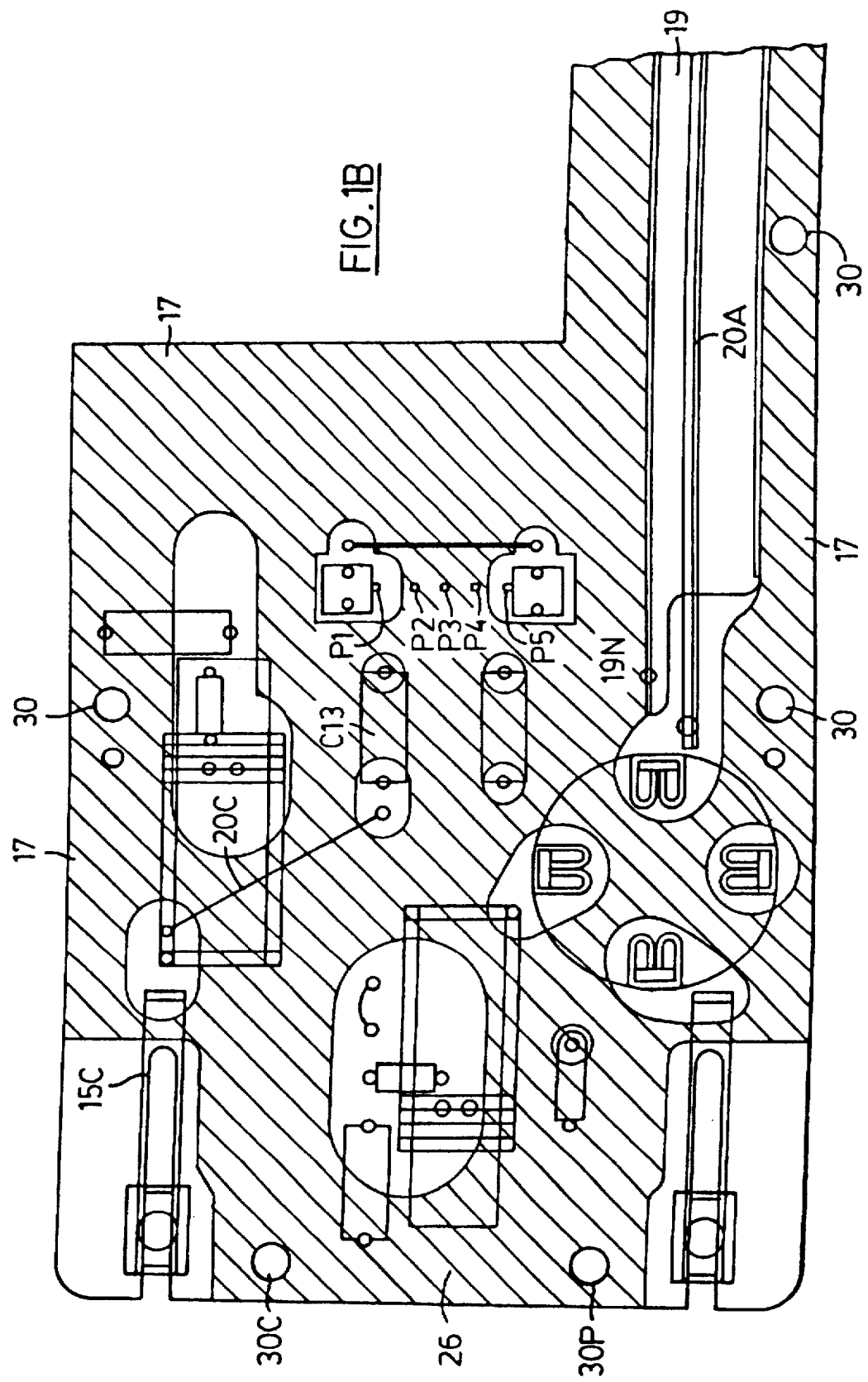

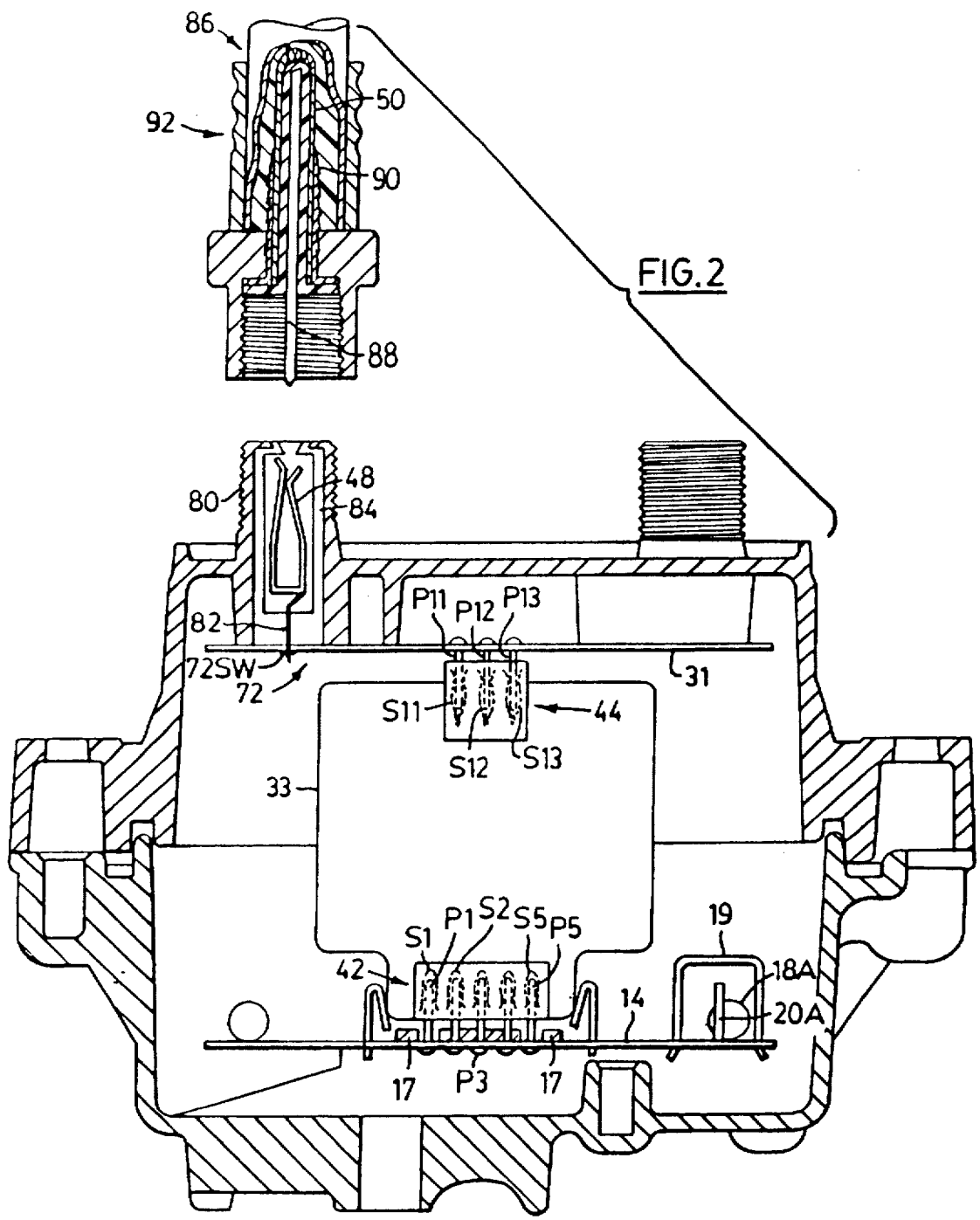

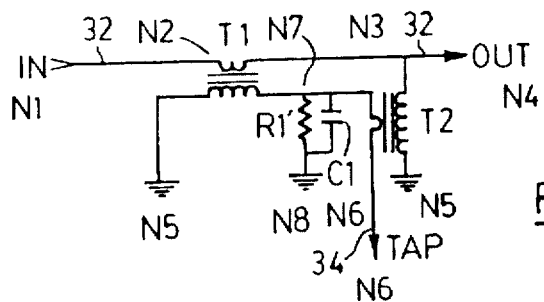
FIG.3A
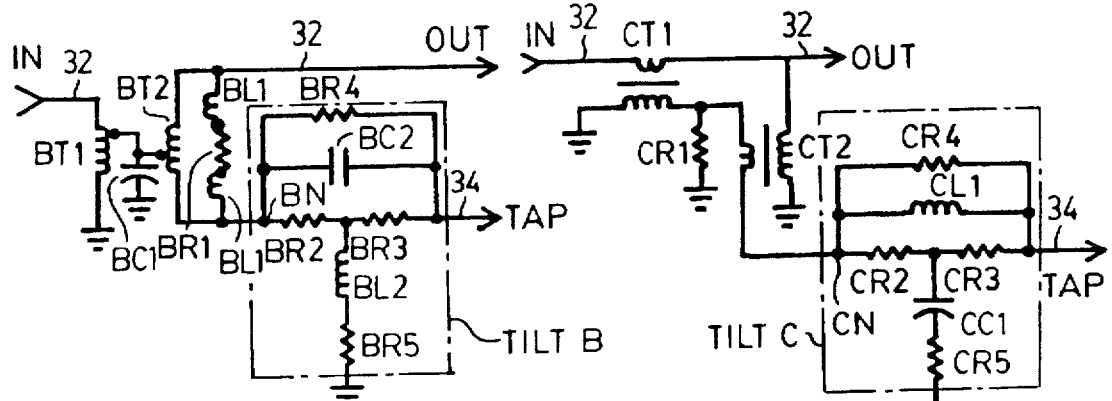
FIG.3B
FIG.3C
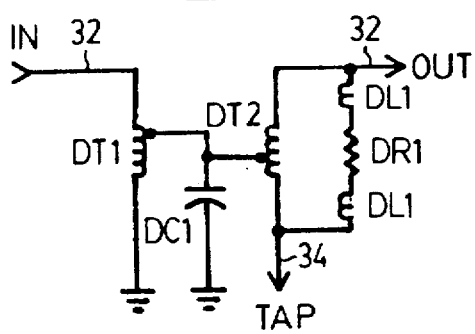
FIG.3D
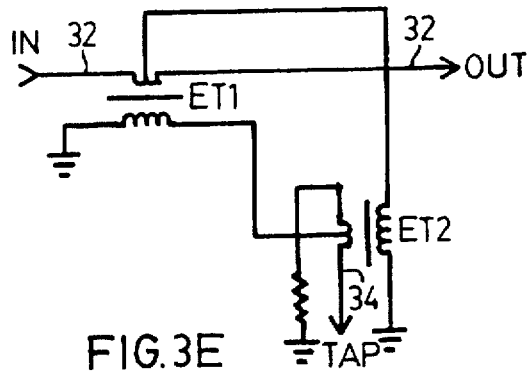
FIG.3E
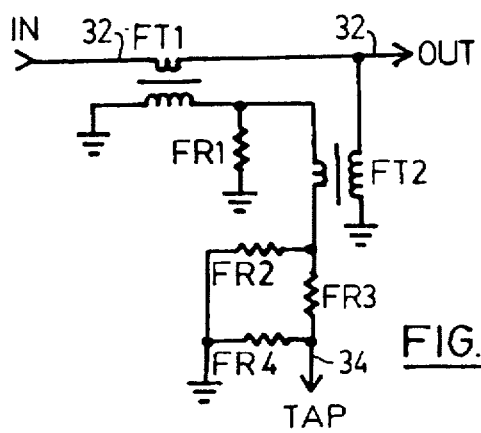
FIG.3F
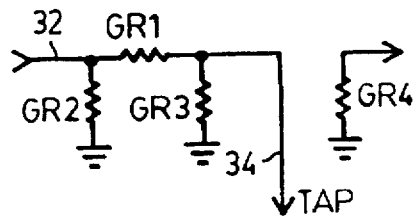
FIG.3G

TOP EXIT COUPLER

This application is a Continuation of application Ser. No. 08/633,527 (U.S. Pat. No. 5,675,300) filed Apr. 17, 1996.

This invention relates to improvements in circuitry and the physical arrangement thereby for use in a conducting housing for coaxial cable distribution networks. By the term "coaxial cable distribution networks", I include Community Antenna Television (CATV) networks, Local Area (LAN) Networks, and other coaxial applications, including those carrying telephone signals, particularly those which require broad-band transmission.

Individual inventions described herein are believed to have applications in radio frequency ('R.F') circuitry beyond the application particularly described herein. The circuitry described herein is designed for RF signals of 5 Megahertz to 1 Gigahertz but is useful at higher and lower frequences than this range.

By "board" herein is meant a flat board of dielectric material on which may be mounted circuits, circuit components, or ground planes. Preferably, the board is the same as those commonly used for printed circuit boards and is made of fibre-glass filled epoxy, although boards formed from other materials may be used. The foregoing discussion applies to the platform board, the coupler board, and the splitter board, described herein.

The housing bottom and lid each may be considered as defining median planes, which planes are generally parallel. The term "bottom", "lid" and the terms "upward" or "downward" to designate respectively directions toward the lid or toward the bottom, are for convenience only. Thus, the housing and lid may be mounted in a wide variety of orientations in use so that (for example) the "bottom" may at the side or above the "lid" and the lid may be at the side or below the "bottom".

BACKGROUND OF THE INVENTION

A conducting housing has a port to receive an incoming RF signal from an upstream coaxial distribution cable. The transmission line characteristics of such coaxial cable are relatively efficient because they provide a relatively consistent impedance between the inner and outer coaxial conductors (usually 75 ohms). At such a port the inner conductor is connected to a main RF path which extends through the housing to another port where it is connected to form the outgoing RF signal on a downstream coaxial distribution cable. In the housings with which the invention is concerned, a portion of the RF signal on the main path is diverted to form the input of a coupler circuit. This diverted RF portion, at the coupler tap or output, is the input to a splitter circuit where it is split into (usually) 2,4 or 8 RF splitter outputs which are connected to the inner conductors of coaxial drop cables, to individual subscribers.

In the housing between the input and output coaxial cables, a main ground current conducting path is required between the outer conductors of the incoming and outgoing distribution coaxial cables. This is to complement the main RF path through the housing so that the main RF path and the ground plane conducting path together electrically simulate an extension of the distribution coaxial cables. Similarly, between the main RF path and the splitter outputs a branch ground current conducting path is required between the main ground current path, and the outer conductor of the subscriber drop cables. This branch conducting path must include a ground current counterpart of the RF signal in the coupler and splitter.

The conducting housing and lid provide a locale for the ground current counterpart of both the main RF path and of the coupler splitter RF path. However, the irregular shape of the housing provides unwanted resonances and reflections to ground currents therein as do the variations in impedance due to the change of local impedances between the respective RF circuits and the housing. Moreover, radiation, reflection, and resonances due to the comparatively strong RF signals (and their ground current counterparts) on the main RF path interact with deleterious effects on the weaker RF signals and ground current counterparts in the coupler and splitter paths. This application will describe how the invention provides better ground current paths than do the housing and lid and thereby reduces the unwanted results set out above.

Frequency compensation circuitry is desirable since the main RF signal travels downstream along the distribution network from tap to tap or housing to housing (one of which will be the housing described and illustrated herein), the higher frequencies are attenuated at a greater rate than the lower. This occurs both in distribution cables and in the circuitry of passive devices such as the housing shown. Prior to this invention devices to compensate for the resultant decreasing positive or increasing negative slope of the frequency spectrum were inserted in the RF main line. Such frequency slope compensation devices therefore caused losses in the RF main line which lowered the signal strength to all users in the system downstream from the compensation device, but it was thought that these losses must be accepted. The frequency compensation of this invention moves the frequency compensation circuitry to the coupler tap output to avoid these losses in the main RF circuit, making system signal deployment more efficient.

DISCUSSION OF THE INVENTION

A platform board is usually mechanically connected to a housing and parallel to its bottom to define the RF path between two distribution cable ports, and at the distribution ports, the RF path is to be connected to the inner conductors of the distribution cable at the respective ports. A coupler board is preferably mounted to extend from the platform board and transverse thereto. The coupler circuit on the platform-adjacent portion of the coupler board carries the RF input circuit from the platform board to the coupler, with the RF input circuit forming an extent of the main RF circuit on the platform board when the coupler board is attached thereto.

The platform-remote portion of the coupler board carries the RF coupler output signal.

A splitter board is preferably mechanically mounted to extend from the platform-remote portion of the coupler and electrically connected to receive the coupler tap port signal.

The splitter circuit provides 2,4, or 8 splitter outputs from the coupler tap port signals. In the drawings, a 4 output circuit from the splitter is used as the example. At each splitter output the splitter RF signal is provided to a subscriber tap port for connection to a drop cable.

Mechanically the platform board will preferably be substantially parallel to the housing bottom and bolted thereto. The splitter board will preferably be substantially parallel to the lid and bolted thereto and also substantially parallel to the platform board from which it is separated by the coupler board. The coupler board is preferably mechanically, as well as electrically supported by pin and socket connections to each of the platform board and the splitter board.

Electrically each of the platform, coupler, and splitter boards has an RF circuit thereon. Each also carries a selectively shaped foil layer designed to constitute a ground plane and ground current path which generally follows the RF circuit on the respective boards to provide an impedance between the RF circuit and the ground plane which approximates the characteristic impedance of the distribution line coaxial conductors (typically 75 ohms).

The ground plane on the platform board (although not discussed in detail herein) will be connected to the conducting housing relatively close to the entrance and exit ports corresponding to the main RF path through the housing. (Thus, using a very short portion of the housing in each case as part of the main ground current path).

By "main ground current path" herein, I mean that part of the ground plane (which cannot be exactly or discretely defined) which serves as the main portion of the connection between outer conductors connected to the housing. There will, in addition, be unwanted ground currents in the housing and ground plane which will be reduced as far as possible by this invention.

The ground plane of the splitter board will be connected to the conducting lid relatively close to the exit (F) ports of the splitter output (subscriber) RF signals from the lid.

The ground plane of the platform is connected through the ground plane of the coupler board through the ground plane of the splitter board and on to the housing in the vicinity of the splitter outputs from the lid to provide an electrically continuous ground current path. This enhances the transmission line integrity of the RF signal path to the splitter by providing a dedicated ground current path from the coupler to the splitter output which will not, to any major degree, recombine with ground currents or main RF currents on the platform board nor be materially affected by them. This effectively separates and shields the ground current paths associated with the splitter signal from the effects of currents on ground current paths associated with main RF line signals. This helps satisfy the fundamental requirement of directivity whereby signals returning through the coupler output line are attenuated with respect to the splitter path to a greater extent than signals entering the coupler through the coupler input line.

The signal isolation between the RF main line signals and the splitter feed is also increased in relation to prior devices, because, in contrast to said prior devices, the relatively low power RF splitter signal is not forced to travel down between the relatively high power RF main line signals on the platform to get to a splitter interface connector.

A particular inventive feature is the incorporation in the coupler circuitry of a frequency sensation or 'tilt' circuit which may be used to modify the signal strength across the RF frequency spectrum encountered there. Such compensation circuit may attenuate higher frequencies relative to lower across the spectrum or otherwise shape the strength of the RF signal relative to the frequency. Such a compensation circuit as incorporated in the coupler circuit causes losses which are a necessary incident of its presence. However, since the compensation circuit is incorporated in the coupler circuit the losses have negligible effect on the main RF circuit and affect only those subscribers who receive that particular coupler's output signal (by way of the associated splitter). This is in contrast to prior practices where frequency compensation circuits are located in the main RF path and cause losses in the main RF signal which affect all downstream taps, housings and subscribers.

BRIEF DESCRIPTION OF THE DRAWINGS

In drawings which illustrate a preferred embodiment of the invention:

FIG. 1 is an exploded view of a cable distribution housing, platform, coupler, splitter, and lid, in accord with the invention.

FIG. 1B is a partial plan view of the platform board showing the preferred contour of the platform board ground plane.

FIG. 2 is a vertical section, taken transverse to the longitudinal extent of a preferred embodiment of the invention in assembled form, and showing a drop cable.

FIGS. 3A–3G are schematic representations of various available coupler circuits.

DETAILED DESCRIPTION OF THE INVENTION

Figure 1A:
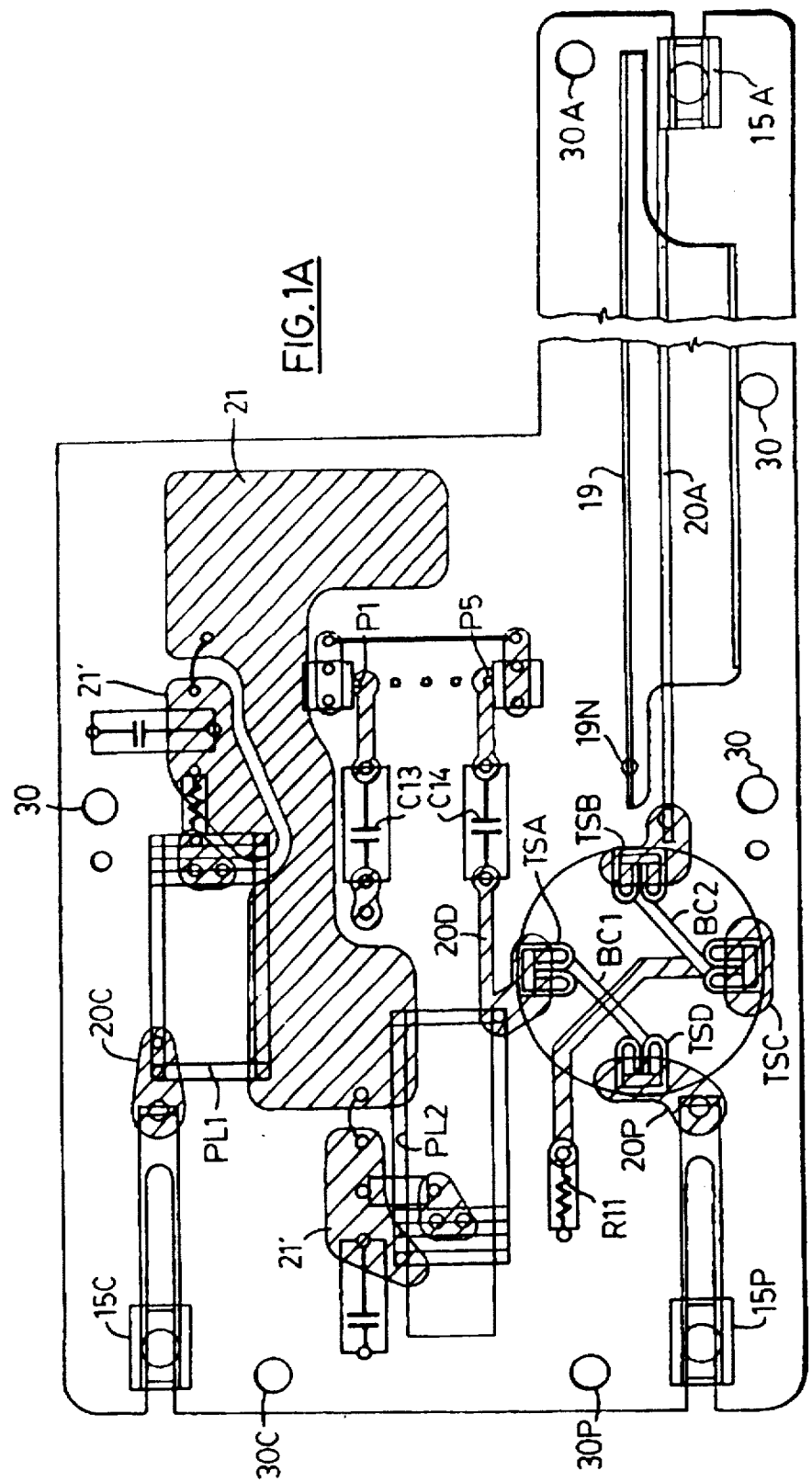
FIG. 1A is a partial plan view of the platform board showing the active components of the main line RF circuitry.

In the drawings, areas shaded with lines upward to the right are on the side of the board nearer the viewer. Areas where the shading is upward to the left are remote from the viewer.

In the drawings: A conducting housing 10 having a bottom and side walls has ports 18C, 18P, 18A for the attachment of exterior coaxial distribution cables thereto (FIG. 1). The housing may be square or otherwise instead of rectangular and may have a variety of differing port arrangements. In any port arrangement, the outer conductor of the distribution cable, not shown, will be electrically connected to the conducting housing adjacent the port and the inner conductor of the distribution cable will be connected to the platform board RF line.

A platform board 14 is bolted to the housing at apertures 30 (including 30P, 30C, 30A) and is typically made of fibre glass filled epoxy resin with the platform board circuit attached or otherwise soldered thereon. The platform circuit defines a main or through RF path and an AC path which coincides with the RP path at each end of the latter and has an extent 22 separate from, but in parallel with an intermediate portion of the RF path.

In the embodiment shown, the platform board defines alternative main RF paths. The RF path to or from port 18C may, at switch TS be connected to port 18P along RF line 20P or to port 18A along line 20A. The switch TS also connects the unused line 20P or 20A to ground. A terminating resistor may be inserted between the unused line and ground if necessary to supply the typical impedance.

A ground plane of conducting (preferably copper) foil indicated by shading 17 (FIG. 1B) is associated with the RF path along its length inside the housing and spaced therefrom to provide an approximate transmission line impedance: so that the impedance between adjacent portions of the RF path and the ground plane approximates the impedance between the inner and outer conductors of the connected coaxial distribution cables. Although different designs place the ground plane on the same or on the opposite side of the board as the RF path, we prefer to provide the platform board ground plane on the same side as the RF signal path. This requires raising the signal path from the board surface to provide an air dielectric between path and plane (not shown) and lowers the effect of the board dielectric on RF transmission line losses from the signal path.

The contours of the ground plane 17 indicated by shading 26 are shown in (FIG. 1B). They will of course be interrupted where necessary to avoid shorting the RF or AC circuits. The ground plane 17, in order to carry the ground current counterparts of RF lines will be electrically connected to the housing at bolt apertures 30 including apertures 30C and 30P, physically adjacent the ports 18C and 18P respectively. There will be a connection to the housing at or adjacent the port 18A. This may be by a bolt at 30A (FIG. 1A) or an alternative electrical connecting means. In general, the ground plane 17 should be connected to the housing at intervals of less than one-half of the wavelength of the highest RF frequency to be carried to lessen the effect of undesired reflections and resonances.

The platform board 14 mounts 5 upwardly directed pins (FIGS. 1 & 2). The two outer pins P1 and P5 are connected respectively to main RF signal path lines 20C and 20D (FIGS. 1 & 1A). The middle 3 pins, P2, P3, and P4 are electrically connected to ground plane 17 (FIG. 1B).

The coupler board 33 is provided with sockets S1–S5 (FIG. 2) to receive respectively pins P1–P5. The coupler board may be reversed relative to the platform board, from the orientation shown. In the reversed orientation coupler board sockets S5–S1 will receive respectively pins P1–P5. Such reversal is required when there is a reversal of signal direction on the main RF signal path. At the same time, the sockets and pins are mechanically designed so that good electrical contact is established between each corresponding socket and pin and the coupler board is supported against vibration perpendicular to the pin axes and in an attitude perpendicular to the platform board.

The coupler board 33 has on one side the main RF input path 32 and coupler tap RF path 34 (FIG. 4) of one of several conventionally known, coupler circuits preferred examples of which are shown in FIGS. 3A–3G. The main RF input path 32 on the coupler board and connecting circuitry between the coupler main RF signal path sockets S1 and S5 are located so far as reasonably possible near the lower or platform-adjacent edge of the coupler board 33, and the coupler tap RF path as far as possible near to the upper or splitter-adjacent edge of the coupler board. Thus the main RF path is connected to the coupler RF path at interface 42 and the coupler output path is connected to the splitter RF input path at interface 44.

The coupler ground plane 38 (FIG. 4) electrically connects near its platform-adjacent edge to the platform ground plane 17 at the platform-coupler interface 42 over the parallel connections of sockets S2–S4 to pins P2–P4. The coupler ground plane 38 (FIG. 4) connects with sockets S11, S13 near its splitter-adjacent edge to the splitter ground plane 40 (FIG. 5) through respective pins P11, P13. The coupler ground plane 38 on the ground plane side of board 33 (FIG. 1) is so located and and so spaced from respective RF main and RF branch paths on the component side of the coupler board so as to approximately provide for them the characteristic impedance relationship that a coaxial outer conductor bears to its inner conductor in a distribution cable.

At the splitter interface 44 the coupler output or tap signal is provided to socket S12 carrying the coupler tap and splitter input signal for connection to pin P12 on the splitter board.

The splitter board is provided with 3 probes P11–P13 (FIG. 2) to electrically and mechanically couple to the respective coupler sockets S11–S13. The splitter board is arranged transverse to the coupler board and the board is bolted by bolts 46 to the conducting lid (FIG. 1). The coupler board when reversed relative to the platform board is reversed also relative to the splitter board, in which case sockets S11–S13 will respectively receive pins P13–P11.

The splitter circuit converts the coupler tap signal received at pin P12 from the coupler tap signal into 2, 4, or 8 (here four) output signals which are carried to the output taps 48 (FIG. 2). The splitter ground plane 40 (FIG. 5) is electrically connected to the conducting lid, and therethrough to the outer conductor 50 (FIG. 2) of the drop cable.

It is desired to briefly describe the platform board 14 in accord with the invention. The platform board is described in relation to FIGS. 1A and 1B. Although these Figures are referred to principally in the following discussion, reference may also be made to FIGS. 1 and 2.

FIGS. 1A and 1B must be considered together to obtain a true plan view. This is because FIG. 1A shows the active RF circuit with components on the near (to the viewer) side of the board and foil planes on the remote (to the viewer) side of the board. FIG. 1B shows the ground plane which is on the near side of the board, in association with indication of the relative location of the active circuit elements.

In the drawings, platform board 14 is designed for attachment to the housing at apertures 30, 30P, 30C, and 30A or by equivalent means. Since such mechanical attachments are also electrical connections, it is worth noting that the location of these apertures includes 30C near a common input port 18C on the housing, 30P near a pedestal input port 18P on the housing, and to an electric connection to the housing at point 30A or through an equivalent connection.

The right hand connection of conductor 20A to a port terminal at 18A is omitted from FIG. 1A as is the trough line 19 outer conductor connection to the housing at 30A.

The terminals 15C, 15P and 15A may be of any conventional type for connection of the RF line on the platform board to the pin, not shown, of the inner conductor of the exterior distribution cable.

The terminals are used in pairs, that is, either 15C and 15P are connected for the pedestal mount or 15C and 15A are used with the aerial mount.

In the drawings, terminal 15C is located to connect the central conductor of a coaxial cable, not shown, at port 18C, across a jumper to RF coupling capacitor C13 to pin P1 of coupler interface 42 to be described and comprises main RF line 20C of FIG. 1. Pin P5 of coupler interface 42 is connected across capacitor C14 to terminal TSA of a transfer switch TS and comprises RF line 20D of FIG. 1. To provide a simulation of a transmission line outer conductor for lines 20C and 20D, is provided ground plane 17 (FIG. 1B) located on the near or viewer's side of board 11. Ground plane 17 is connected to the housing at 30P (as well as at the other apertures 30) and is shaped and located to act as an extension of the outer conductor of a coaxial distribution cable connected at port 18C at which the distribution cable outer conductor is connected to the housing as well known to those skilled in the art. At each terminal in use the housing portion of the outer conductor simulation (between the distribution cable outer conductor and the ground plane) is very short. Thus, the ground plane 17 simulates an outer conductor to approximate transmission path line impedances for lines 20C and 20D of FIG. 1. Moreover, ground plane 17 is electrically connected to pins P2, P3, P4 for connection to coupler ground plane 38.

In addition, the platform ground plane 17 is electrically connected to the housing at each aperture 30 (FIG. 1B) and the attempt is to make grounding connections at intervals of less than half the wavelength at the highest RF frequency employed.

Transfer switch TS (FIGS. 1,1A,1B) is a device well known to those skilled in the art. It provides stationary terminals TSA, TSB, TSC and TSD, at 90° locations and ganged rotary bridging elements BC1 and BC2 (FIG. 1A) (adapted to connect) adapted to connect either TSA to TSD and TSB to TSC, as shown or TSA to TSB and TSC to TSD.

Terminal TSD is connected to terminal 15P along line 20P. At 20P the RF line is connectable to the central conductor of a coaxial distribution cable connected to port 18P. At the same time, the ground plane 17 is shaped to provide a simulation of a transmission line outer conductor from the vicinity of the transfer switch terminal TSD to aperture 30P where the ground plane 17 is electrically connected to the housing adjacent to the point where the outer conductor of a distribution cable will be electrically connected to the housing at 18P. Thus, the housing portion of the outer conductor simulation path is very short.

Terminal TSB is connected to the central or signal conductor 20A of partially surrounded by a trough line outer conductor 19. Strip 20A is electrically connected to a terminal 15A, similar to terminals 15P and 15C, and terminal 15P is connectable to the inner conductor of a coaxial distribution cable connected to port 18A.

The outer conductor simulation at port 18A is provided by a trough line outer conductor 19 electrically connected to ground plane 17 at node 19N and electrically connected to the housing by means not shown, (preferably at aperture 30A) adjacent port 18A. The trough line outer conductor 19 is spatially related to conductor 20A to provide approximate transmission line impedance relative thereto.

Terminal TSC is connected to the ground plane 17. In some installations it may be necessary that the connection to ground plane 17 be through a resistance R11 which simulates the transmission line impedance to parasitic oscillations on line 20P or 20A when unused. In some installations however an acceptable approximation is achieved by the radio frequency qualities of the general configuration without the resistance R11 in which case terminal TSC may be connected directly to the ground plane 17.

On platform board 14, the terminal 15C is also connected over power coil PL1 foil patches 21 and 21' and power coil PL2 to terminal TSA in accord with well known techniques to provide AC line 22.

In operation, with the switch TS as shown, the main RF signal travels from terminal 15C to pin P1, through the coupler input circuit to be described later, to pin P5 then to terminal TSA, across the transfer switch TSA-TSD bridge to terminal 15P. This would be for a pedestal mounting. It must be remembered that the RF signal may flow in either direction, but when it is reversed the coupler sockets S1 to S5 must be reversed relative to platform board pins P1 to P5.

With the switch in the above setting, the other set of bridging contacts connects the then unused conductor 20A to ground plane 17 either through resistance R11 which has a typical line impedance (usually 75 ohms) or directly if the typical impedance is simulated by the radio frequency qualities of the configuration. This has the effect of reducing any tendency for parasitic RF signals in the unconnected conductor 20A to affect the RF signal.

With the transfer switch connecting TSA to TSB and TSC to TSD, the RF circuit extends from terminal 15C to terminal TSA as previously described. From TSA, it travels to TSB and down trough line 20A to the terminal 15A, at port 18A for connection to the inner conductor of a coaxial distribution cable connected at that port. The outer conductor simulation path includes the ground plane from terminal 15C to TSA and the trough line shield 19 from TSB to the housing adjacent port 15A.

Again in this switch setting the RF path may be reversed, accompanied by reversal of coupler sockets S1–S5 relative to pins P1–P5.

It is within the scope of the invention to provide a housing wherein the ports are otherwise arranged.

It is within the scope of the invention to provide a square housing in which case the trough line 20A and shield 19 are eliminated and the terminal TSB connected to an aerial port.

It is understood that a housing may have only aerial or only pedestal ports. With either the transfer switch will be eliminated and only the desired port remains.

The coupler circuitry will be discussed in more detail.

Some typical coupler circuits will first be discussed briefly in relation to FIGS. 3A to 3G. The circuits of FIGS. 3B–3G carry elements designated as shown wherein the element designations commence with a letter corresponding to the Figure designations. Thus voltage and circuit transformers corresponding to T1 and T2 are in FIGS. 3B, 3C . . . labelled BT1 and BT2, CT1 and CT2, . . . . A preferred physical arrangement of one of the typical circuits will then be shown in FIG. 4. In accord with an important feature of the invention, the coupler circuits shown are combined with circuitry for frequency response correction.

Typical coupler tap outputs (splitter inputs) are provided by the typical circuits as follows:

FIG. 3A—mid range 10, 13 or 16 dB TAP

Figure 4:
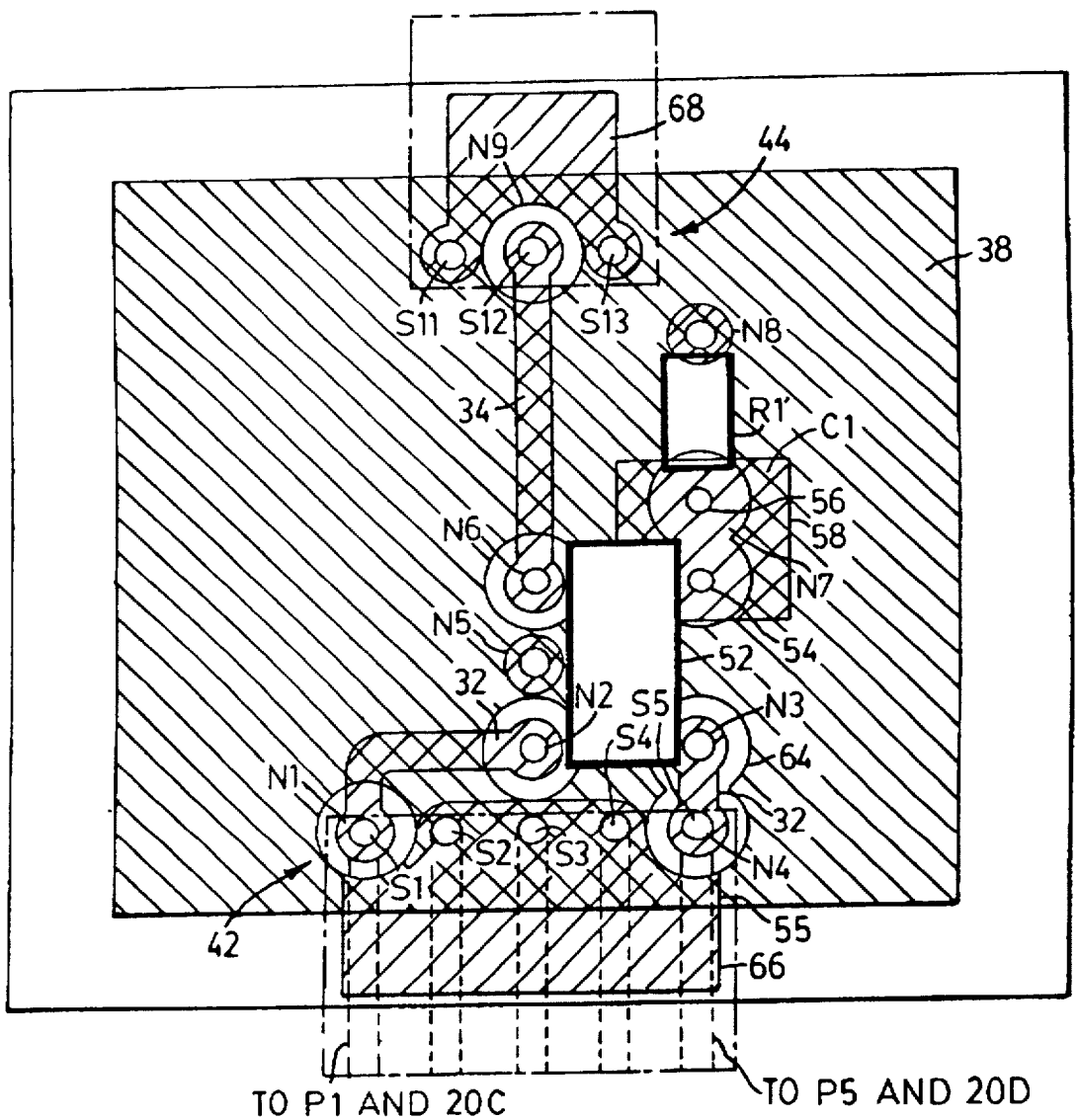
FIG. 4 shows a partially schematic representation of the physical layout of a coupler circuit for use at approximately the middle available tap value.

FIG. 3B—4 dB tap value with positive slope or tilt compensation (see page 21 line 12)

FIG. 3C—19,22,25 and 28 dB value with negative slope or tilt compensation (see page 21 line 12)

FIG. 3D—4 dB tap value without compensation

FIG. 3E—7 dB tap coupler

FIG. 3F—19,22,25 and 28 dB value coupler

FIG. 3G—0,3 or 6 dB terminating coupler

The design and selection of circuit values to obtain coupler tap values of from 4 to 25 dB is well known to those skilled in the art.

The design and useful frequency value slope compensation circuits per se and are well within the capacities of those skilled in the art. However, it is considered novel to locate such a frequency compensation circuit between coupler and splitter and to physically arrange it as shown and described.

It is now desired to describe, with reference to FIG. 4, as an example, the preferred physical distribution of the coupler of FIG. 3A.

In FIG. 3A, nodes have been indicated by N1 to N9. The same nodes are similarly indicated in FIGS. 4 and 4A which schematically show the physical arrangement of the components of FIG. 3A.

FIG. 4 shows the actual location of the mid tap value coupler. The nodes numbered from N1 to N9 correspond to those similarly designated on FIG. 3A. On FIG. 4 the downwardly facing platform interface sockets S1 and S5 are schematically dotted in, so that the main RF path input and output may, respectively be considered as entering and leaving at respectively S1 and S5 (if originating at common port 18C) or alternatively at respectively P5 and P1 if leaving at common port 18C in which case the coupler board would be reversed from the position shown in FIG. 4 relative to the platform and splitter.

Since the coupler is directional, the coupler board terminals S1, S5 must be respectively connected to the input and output RF terminals. On the coupler board as shown in FIG. 4, the components are mounted on the side nearer the viewer, but the ground plane is on the viewer-remote side of the coupler board. In this way, the builder or designer uses the dielectric value of the coupler board to provide the desired impedance to ground. It will be noted that the middle three pins P2–P4 of the platform are connected to the platform ground plane 17 (FIG. 1B) which is preferably, not necessarily, on the component side of the platform board that is the side remote from the housing bottom.

The coupler input terminal, node N1 at socket S1 (FIGS. 3A, 4) is connected to node N2 and from there through the input winding of the step up transformer T1 at coupler core 52 (to be hereinafter described). The other end of the transformer T1 primary is connected to node N3. Node N3 is connected to the main RF output at node N4 which corresponds to the RF output socket S5. Connection will then be established from S5 to P5 and the platform board main RF line 20D. Node N3 is also connected to the input of step down transformer T2 (also encompassed in core 52) which is connected to ground as shown. Node N5 is connected through the secondary of transformer T1 across node N7 and, from there through the secondary of transformer T2 to node N6.

Node N7 is connected to ground at node N8 through resistor R1' and capacitor C1 in parallel (FIG. 4). The tap output signal appears at node N6 for connection to the central socket S12 for providing the coupler output signal to pin P12 of the splitter.

The capacitor C1 may be a discrete element but may also be, as indicated in FIG. 4, where node N7 is divided into two electrically connected anchors 54 and 56 on the coupler board and connected to a patch layer 58 on the component side of the coupler board. The electrically connected patch and node N7 are connected to R1', and the primary of T1. In some cases the patch is believed to give better capactive values over the bandwidth than a discrete capacitor. The resistor R1' is a discrete element. As shown in FIG. 3A, the effect is to provide C1 and R1' in parallel from node N7 to ground at node N8.

Figure 4A:
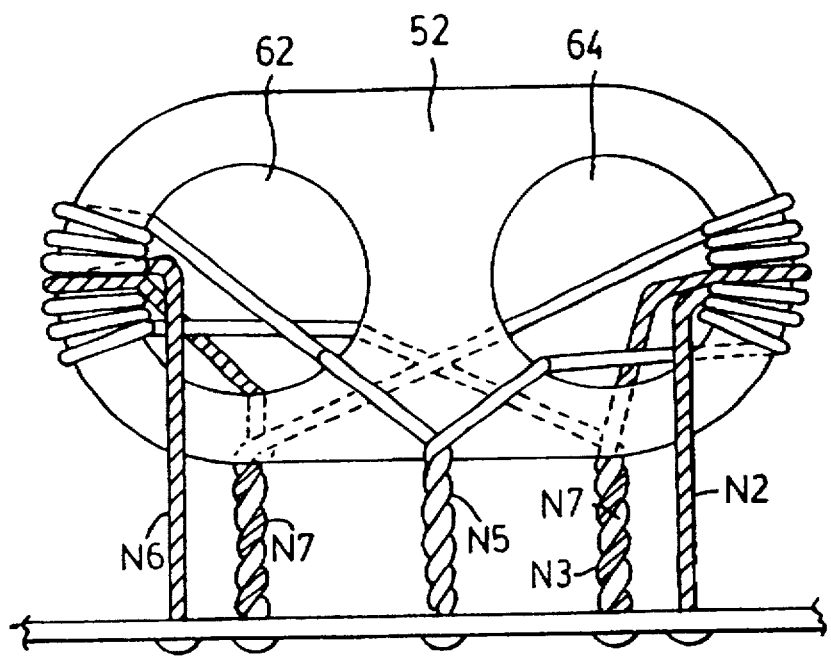
FIG. 4A shows a preferred embodiment of two of the transformers of FIG. 4 and of its schematic counterpart FIG. 3A.

FIG. 4A shows a preferred form of the transformers T1 and T2 in the ferrite core 52 with a pair of bores 62 and 64. Nodes on FIG. 4A indicate somewhat schematically the physical position of the nodes indicated in FIGS. 3A and 4.

The conductors of FIG. 4A are insulated from each other along their turns but with their insulation removed at the twisted junctions. Thus considering FIG. 4A which is a somewhat simplified and enlarged view of a real article and the shaded conductor from node N2 to node N3 is the primary of the step up transformer T1. The plain coil from node N5 to node N7 represents the secondary. The plain conductor from node N3 to node N5 will form the primary of transformer T2 while the conductor from node N7 to node N6 represents the secondary of T2.

In FIG. 3A it will be noted that two locations are shown for the node N5 signifying that a connection between them whether by twisting together as in FIG. 4A or across the ground plane (because of their proximity) is between points on the ground plane at substantially equal potential at the RF frequencies used. This is an exception to the more general rule in the circuitry shown where the ground connections, although they would all represent the same potential in circuitry at lower than radio frequencies, are subject, at radio frequencies to potential differences which create the "ground currents" in the ground planes. It is a principal object of this invention to manage the ground currents to reduce losses in the RF signals.

In operation, the circuit of FIGS. 3A, 4 and 4A has its component values selected to produce the desired tap value for the splitter at node N6. Values are determined by the values of the circuit components and of the transformers turns ratio.

The basic coupler circuitry of FIG. 3A is well known to those skilled in the art. What is novel is (1) the physical arrangement of such circuitry to provide ground planes to simulate transmission line features for the RF circuits and (2) the physical spacing on the coupler board of bottom entering main RF circuits with its accompanying ground plane from the upper exit tap 34 (splitter) RF circuit with its accompanying ground plane.

It is noted that the orientation of the coupler board must be reversed when the signal on RF path 20 on the platform board is reversed.

It is now desired to discuss two of the more important features of the invention, namely how signal losses are reduced due to provision of a simulated transmission line using the ground conductor to complement the coupler board RF signal paths, and how signal losses are reduced because the relatively weak RF signals on the coupler output and tap path are physically isolated from the relatively strong signals on the main RF signal path.

Thus on FIG. 4, a ground plane 38 of conducting foil, (usually copper) is placed on the opposite side to the component side, except where it must be interrupted to avoid short circuiting the active components. Moreover the physical spacing chosen from an active signal element or RF path to the adjacent edge of ground plane 38 is chosen to approach the transmission line impedance from the signal path. This of course must take into account the dielectric qualities of the coupler board. This use of the ground plane to complement the RF paths and simulate a transmission line not only tends to maintain the integrity of the signal but to prevent the interference between the signals on the lower main RF path and the signals on the top coupler and tap RF path. The isolation of and integrity of the coupler and tap RF signals is improved by connecting the ground plane 38 of the coupler, adjacent the main signal interface 42 to the ground plane of the platform (at pins P2–P4), shown fragmentally at 17 of FIG. 2, adjacent the same interface 42 and by connecting the ground plane 38 of the coupler adjacent the splitter interface 44 to a ground plane on the splitter to be described. At the platform-adjacent end of the coupler board, 5 downwardly directed sockets S1 to S5 are located for respective conducting contact with five pins P1 to P5 from the platform board. The three central pins P2–P4 and sockets S2–S4 represent, therefore, connections between the ground plane of the platform board and the ground plane of the coupler board. Foil extension 66 (FIG. 4) on the component side (lower) end of the coupler board extends down to overlap the junction of RF pins and sockets P1–P5 and S1–S5. Ground plane 38 is connected to and from the coupler ground plane extension 66 which provides shielding for the main RF current signals and an approximate transmission line impedance therefor since the foil extension 66 is connected to the coupler ground plane 38 and therefor is connected to the platform ground plane by sockets S2–S4 receiving pins P2–P4.

Figure 5:
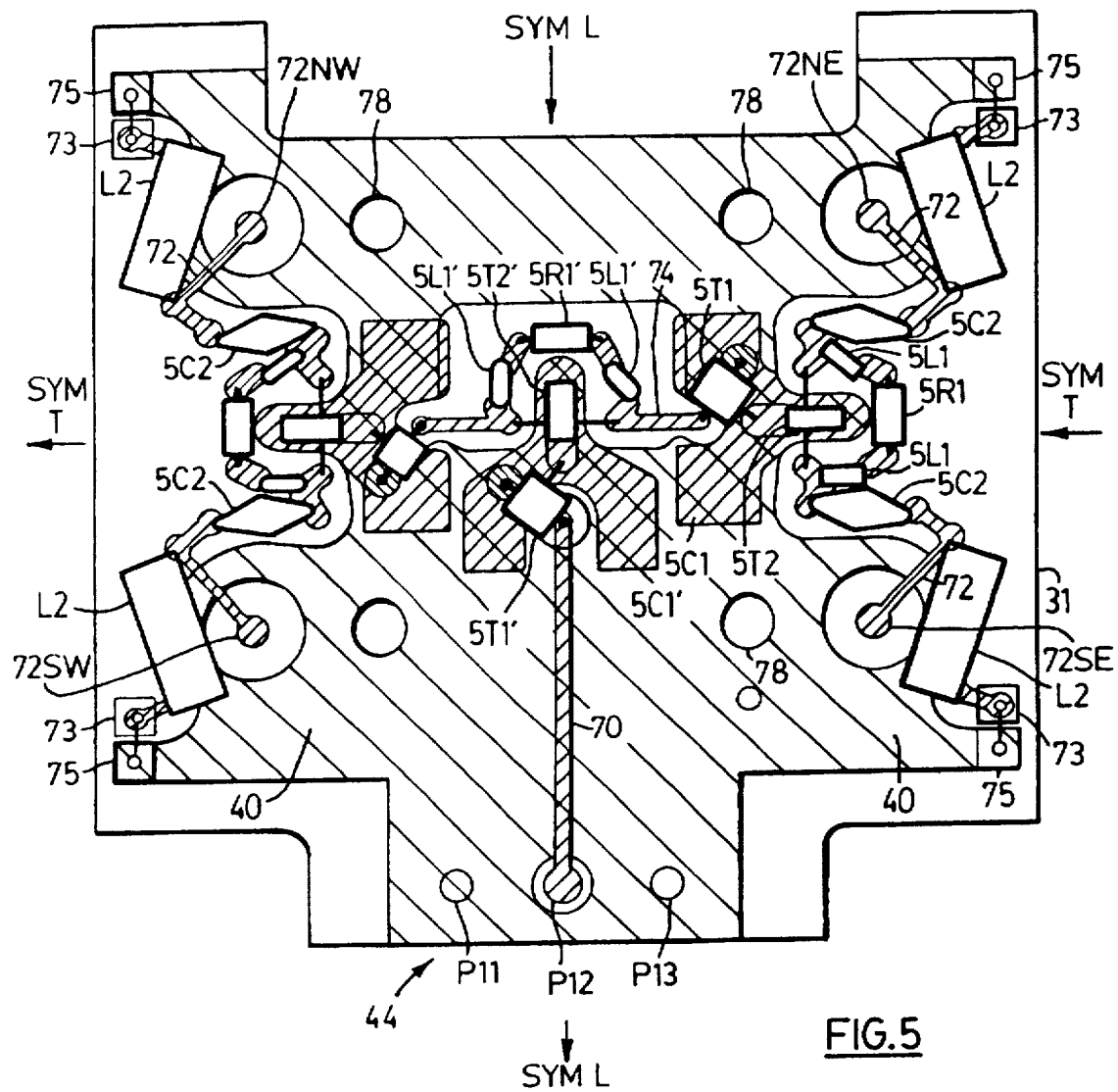
FIG. 5 shows a partially schematic representation of the physical layout of a splitter circuit.

Similarly, the lid-adjacent end of the coupler (FIG. 2) has three sockets S11–S13 for receiving complementary splitter pins P11–P13. The central socket S12 and pin P12 connect the tap output of the coupler to the splitter input. The outside sockets S11 and S13 and pins P11 and P13 connect the ground plane of the coupler to the ground plane of the splitter. Moreover, the location of the pin-socket connections at the coupler-splitter interface 44 is provided with a foil extension 68 (FIG. 4) of the coupler ground plane 38 but located on the component side of the coupler board, to assist in (1) shielding the splitter signals from other signals present in the housing, and (2) providing the RF signal line extending from coupler tap path 34 (FIG. 4) to splitter input 70 (FIG. 5) with the transmission line simulation contributed by the other conductor impedance between such RF signal line P12, S12 and the ground planes 38 (FIG. 4) and 48 (FIG. 5).

FIGS. 3B to 3G show other coupler circuits wherein the signal main RF line 32 between "IN" and "OUT" from the platform board, is converted to an output along line 34 at "TAP".

In FIGS. 3B to 3G elements are designated starting with the letter of the Figure number followed by a letter related to the electrical component involved. Thus, for example:

BR1, BR2 etc. are resistors in FIGS. 3B

CC1 is a condensor in FIG. 3C

DL1 is an inductor in FIG. 3D

In particular the coupler voltage transformers are represented by BT1, CT1, DT1 ... etc and the coupler current transformers by BT2, CT2, DT2 etc.

In relation to each of FIGS. 3B to 3G the physical arrangement of the components on a coupler board will be designed to provide similar advantages for the circuit 3B to 3G as the physical arrangement of FIG. 4 provides for the circuit of 3A. The similar advantages include (1) that the physical embodiment of each of the circuits of FIGS. 3B to 3G provide a ground plane (analogous to ground plane 38) for coupler board 33 (a) bearing the approximate impedance to the coupler circuits on board 33 and (b) provide electrical connection at its lower portion to the ground plane (analogous to 38) to ground plane 17 of platform board 14 and at its upper portion to the ground plane 40. The coupler ground plane is arranged relative to the RF paths on the coupler to provide it with the characteristic transmission line impedance and the geometry of the coupler ground plane will, as in FIG. 4, physically distance coupler ground plane currents associated with the coupler input from coupler ground plane currents associated with the coupler output.

It is an important feature of the invention that the coupler circuit can incorporate circuitry with a frequency compensation circuit to modify the tap output supplied to the splitter. As the main RF signal travels in the distribution network through housings (one of which is the housing and its circuitry shown), the high frequencies in the main RF signal are attenuated at a greater rate than the lower. This occurs both in distribution cables and in the circuitry of passive devices such as the housing shown. Thus, the RF main-line signals leave from an upstream amplifier with a slope across the frequency spectrum so that the high frequencies have a higher level than the lower frequencies. As the signals travel downstream through the distribution cable and passive devices, the slope changes at the housings so that, before the next amplifier in the cascade boosts the signal levels, the low frequencies are usually at a higher level than the high frequencies. Thus, at each passive device coupler, a different frequency response is required in order to provide to the splitter, and the subscribers a signal which is relatively level across the spectrum.

It is an important feature of this invention that the coupler board, with bottom entrance for the main RF input and the accompanying ground plane connection to provide transmission line characteristics and top exit for the coupler-to-splitter output and the accompanying ground plane connection to provide transmission line characterists, allows the provision, in combination with the coupler circuit, of tilt circuitry for modifying the coupler output to provide a level frequency characteristics, where such circuitry may be individually designed for each coupler's presence in the cascade.

Thus in FIG. 3B is shown a tap for location designed well downstream from an amplifier with the element selected to make positive slope compensation, that is a signal frequency spectrum sloping negatively with increasing frequency into a comparatively level frequency response at the coupler output. Thus, in FIG. 3B the circuit components enclosed by the dashed frame TILT-B provide positive slope compensation. Thus capacitor BC2 is selected to supply the coupler signal appearing at node BN to tap output 34 with attenuation which decreases with increasing frequency. Further, inductor BL2 acts on the signal for BN through resistors BR2 and BR3, to ground a portion of the signal going to line 34 in a proportion decreasing with increasing frequency. Thus, the effect of BC2 and BL2 is to provide a more positive slope to the frequency response curve than that appearing at node BN. The magnitude of the effect is controlled by the selection of the resistive, capacitive and inductive values of components in the circuitry TILT-B in accord with principles well known to those skilled in the art. The circuit uses center tapped transformers to keep input and output impedances close to the normal system impedance.

FIG. 3C shows a coupler with modification circuitry designed for location just downstream from an amplifier having a relatively high tap value and modifying a positively sloping frequency strength curve, to provide a more level output. Thus, in FIG. 3C, the circuit components enclosed by the dashed frame TILT-C provide negative slope compensation. Thus inductor CL1 is selected to supply the coupler signal appearing at node CN to tap output 34 with attenuation which increases with increasing frequency. Further, capacitor CC1 acts on the signal from CN through resistors CR2 and CR3, to ground a portion of the signal going to line 34, in a proportion increasing with increasing frequency. Thus, the effect of CL1 and CC1 is to provide a more negative slope to the frequency response curve than that appearing at node CN. The magnitude is controlled by the selection of the resistive, capacitive and inductive values of components in the circuitry TILT-C in accord with principles well known to those skilled in the art.

Although FIGS. 3B and 3C show the common types of frequency spectrum compensation circuits, other circuits for selectively modifying the signal strength across the frequency spectrum in any selective or desired manner may be incorporated in the coupler circuit, instead of the circuitry in TILTR-B or TILT-C and are considered within the scope of the invention.

FIGS. 3D to 3F show coupler circuitry which, in accord with the invention, may be arranged on-the coupler board in analogy to FIG. 4 to provide a ground plane approximating the transmission line impedance and connected to the platform and splitter ground planes and arranged so that the RF input on line 32 from the platform board is near the bottom of the coupler board and the output of the coupler circuit (3D–3F) (as with the circuits 3A–3C and 3G) travels on a physical line 34 a relatively long distance upward to the coupler output at S12 near the top of the coupler board. Because of the length of physical line 34, in each variant (which is preferably as long as the coupler board dimensions permit) and because of its upward direction, the coupler output S12 is physically separated from the main RF path 32 to reduce the effect of ground plane currents due to the main RF path signals have very much reduced (compared to prior art arrangements) effect on the coupler output-splitter input signals.

FIG. 3D shows a coupler suitable for low tap loss which used an equal two-way splitter.

FIG. 3E shows a coupler suitable for tap values of 7 dB.

FIG. 3F shows a high tap value coupler where the upper limit of tap values available by turns ratio adjustment are raised by the resistance pad provided by FR2 and FR4.

FIG. 3G shows the circuitry for terminating a transmission line where the value of GR4 is 75 ohms.

The circuitry represented by the schematics of FIGS. 3A–3G represents coupler circuits well known to those skilled in the art who will be well able to provide alternative circuits and, in all cases to select the element values to provide the tap values desired. The operation of frequency compensation portions of the circuitry will also be obvious to those skilled in the art.

It is, however, believed new to provide the frequency compensation circuitry (See FIGS. 3B and 3C) incorporated in the coupler circuit so that each coupler output(splitter-input) may be individually adjusted to provide the desired frequency spectrum to the splitter (hence forming the subscriber's signal).

It is further thought to be new to provide the frequency compensation circuitry in the coupler RF path rather than in the main RF path. As pointed out in the introduction such circuitry in the main RF path causes losses which lower the signal strength to all downstream locations. Whereas with the frequency compensation circuitry in the tap path losses (except perhaps for a negligible amount) affect only those subscribers connected to the splitter associated with the particular coupler.

The circuitry of FIGS. 3B–3G and equivalent circuitry thereto will be physically arranged, using circuitry similar to that of FIGS. 3,4 to provide RF main path circuitry near the bottom of the coupler board, and, RF coupler output, splitter input path circuitry, near the top of the coupler board. This assists in the provision of a ground plane providing transmission line simulation for the main and tap RF paths. The lower entrance and top exit physical arrangement of RF paths with the ground planes, provide greater than previous isolation of the low level RF signal in the coupler output and splitter circuits and their ground currents from the high level main RF signals and their ground currents.

Figure 5A:
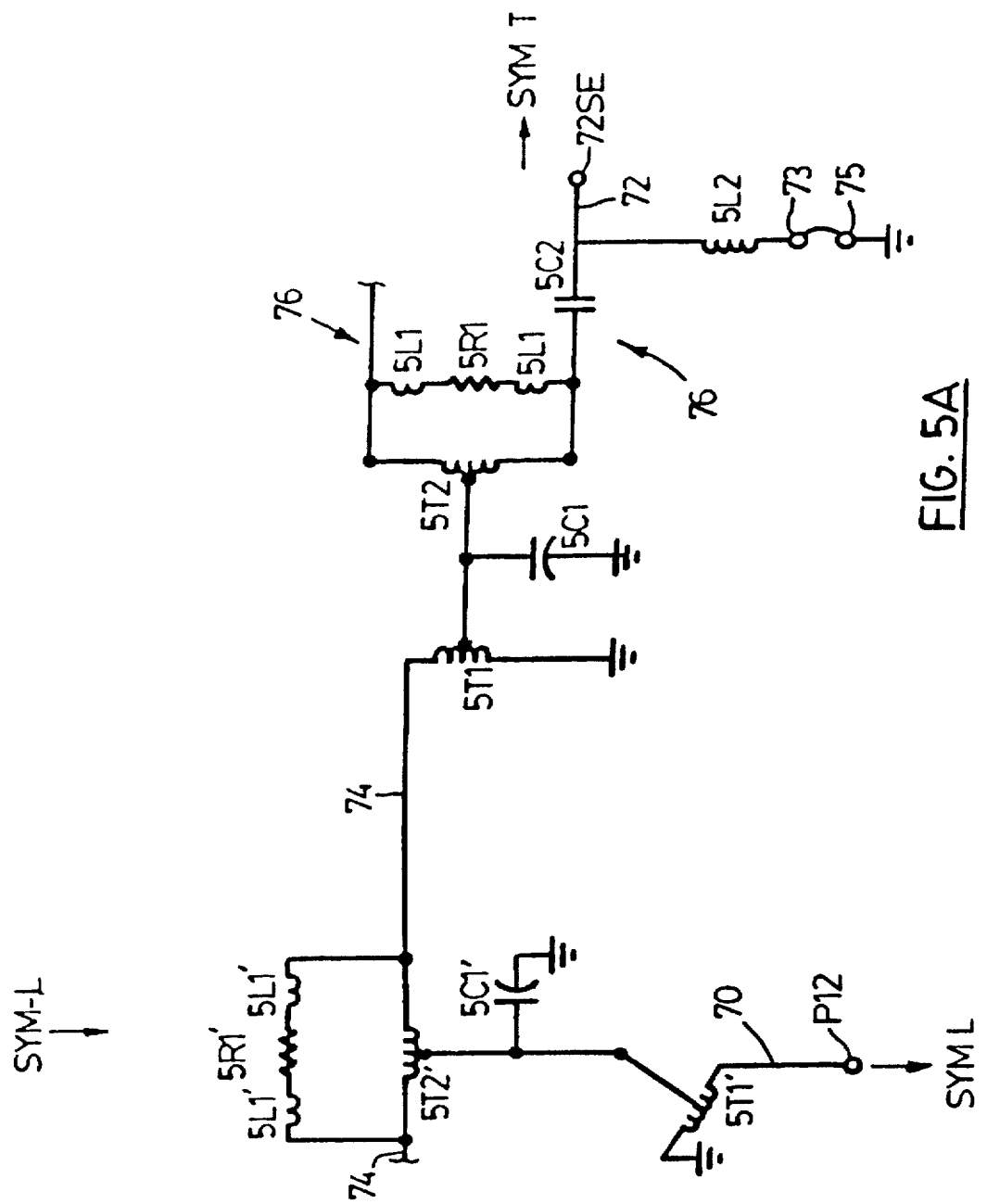
FIG. 5A shows a schematic representation of circuitry of FIG. 5.

The splitter circuitry is specifically described in FIG. 5 (physical arrangement) and 5A, electrical components. For brevity it is noted that, in FIG. 5A the electrical circuitry is symmetrical about longitudinal axis of symmetry SYM-L and, with the exception of the entrance circuitry, symmetrical about the transverse axis of symmetry SYM-T. Accordingly, FIG. 5A provides component designations for the entrance circuitry and the lower right quadrant of FIG. 5. It will be understood that, in accord with the existing symmetry, the elements shown in the lower right quadrant of FIG. 5 have corresponding elements and values in the other three quadrants.

The ground symbols shown in FIG. 5A represent connections to the splitter ground plane 40. The splitter ground plane and the ground connections shown would represent substantially identical (usually considered zero) potentials to relatively low AC frequencies. However, at the RF signal frequencies employed in the splitter circuitry, the potentials at the various ground points will differ to a sufficient extent to provide ground current interactions which can affect the signals in the splitter circuit. It is for this reason that the ground plane 40 is arranged to provide that its ground currents tend to provide transmission line compatibility with the splitter RF circuit, between the splitter entrance P12 (FIG. 2) and its F Port outlets (FIG. 1).

In FIGS. 5 and 5A the following component meanings apply

| Components ending in | Are |
| --- | --- |
| -L1 | Delay Line Inductors |
| -L2 | Power Inductors |
| -T1 | Matching Transformers |
| -T2 | Hybrid Splitter Transformers |
| -R1 | Resistors |
| -C1 | Impedance matching capacitors |
| -C2 | D.C. blocking capacitor |

In the splitter shown, the coupler tap output, on pin P12 to socket S12 at the coupler splitter interface 44 is brought on line 70 to matching transformer 5T1' whose intermediate winding output is connected to the ground plane through blocking capacitor 5C1' and also connected to the intermediate input of hybrid splitter transformer 5T2' is the series circuit S51', 5R1' and 5L1'. This series circuit provides that a reverse direction RF signal from the circuits to the right, or the left of 5T2' does not send an appreciable signal to the circuit on the other side since any such reverse direction signal sent across the winding of 5T2' is substantially cancelled by the signal across 5L', 5R1', 5L1' in series. (The splitter will provide splitter output signals at each of splitter output points 72SW, 72NW, 72NE, and 72SE, shown in FIG. 5), along lines 72.

The signal across the right hand half of winding 5T2' is connected across the entire winding of matching transformer 5T1 and the transformer intermediate terminal is connected to the ground plane through capacitor 5C1 and also the intermediate terminal of hybrid splitter transformer 5T2. In parallel with the transformer 5T2' is the series circuit 5L1, 5R1, 5L1. The effect of the series circuit as in the similar series circuit previously described is that a reverse RF travelling signal from one of the splitter output points 72NE or SE above or below the hybrid 5T2, when it travels across the hybrid winding is substantially cancelled by the similarly originating signal travelling across the 5L1, 5R1, 5L1 circuit. Thus a reverse travelling signal originating on one of the drop cables and arriving from there at point 72SE or 72NE does not provide a substantial signal on the counterpart drop cable.

As shown on FIGS. 5 and 5A, an inductor 5L2 connects the lines to each of 72SE, 72SW, 72NW, 72NE to the ground plane at node 73 which is connected to the ground plane at 75. Inductor L2 is important for tuning the impedance at the low (5 MHz) of the spectrum.

It will be noted that the circuit from transformer hybrid 5T2 to an upper right, or upper or lower left, splitter output will be substantially identical to that shown in FIG. 5A point to the lower right output interface, so that only the latter will be described. Thus the lower end of hybrid splitter transformer 5T2 is connected to ground plane 40 through blocking capacitor SC2, and also the lower right splitter output point 72SE. Inductor 5L2 is important for tuning the impedance at the low end of the RF spectrum. The upper end of hybrid 5T2 is connected (not shown) through similar circuitry to that of FIG. 5A to the upper right splitter output point 72NE.

In the circuitry of FIG. 5A, the series circuit containing 5L1,5R1, and 5L1 serves the same purpose as the circuit containing 5L1', 5R1' and 5L' previously defined in providing, for a reverse RF signal from one of splitter output points 72SE or 72NE a circuit which, at the opposite end of winding 5T2 a signal which canels the effect of the reverse RF signal on the splitter output signal at the other of splitter output points 72SE or 72NE.

It is an important feature of this invention that the ground plane 40 on the splitter board 31 (as with the ground plane on the other P.C. boards) provides (1) shielding and helps provide isolation of the splitter circuit signals from other signals in the housing, (2) provides, as nearly as possible, one conductor of the transmission line simulated paths of which the other conductor in each case is the RF splitter signal circuit. Thus, in each section of the splitter as in the coupler, the ground plane 40 is located to approximate the characteristic transmission line impedance from the adjacent RF line. The "adjacent RF line" includes, respectively, RF line 70 to 5T2', two RF lines 74 to 5T2.

Four apertures 78 in the splitter board allow its attachment to the roof of the housing, by bolts 46 (FIG. 1). The splitter board is mounted with its ground plane 40 upward and its component side downwardly.

FIG. 2 is a somewhat schematic end view of the housing and lid showing an end view platform board 14, interface 42, coupler board 33, interface 44, and splitter board 31. A pair of F tap spigots 80 (FIG. 2) are shown, the left one in section where a lead 82 is shown, from a splitter RF output 72SW to a chamber with insulation 84 having an upward opening with a pair of resilient conducting jaws 48. The drop cable 86 is designed so that its central conductor 88 makes a conducting connection with the jaws 48 and thereby to the output port 72 while its outer conductor 90 is arranged in threaded mount 92 to electrically contact the lid when the mount is bolted onto the housing. It will be noted that the threaded mount and the housing are connected to splitter ground plane 40, principally about mounting apertures 78 (FIG. 5). It should also be noted that the housing portion, the ground current path from ground plane 40 to outer conductor 90 is through a very short extent of lid and spigot which assists in the ground current management and transmission line simulation in combination with the RF signal path 72, 48, 88.

It should also be noted (FIG. 5A) that a reverse signal from the subscriber on line 88 travels to point 72 and from there on line 76 reaches one end of a winding 5T2. The signal tendency to flow down the other line 76 is substantially eliminated by delay circuit 5L1, 5R1, 5L1. However, the reverse signals flowing along line 76 do travel along line 74 to the transformer 5T2' and are prevented from travelling the other line 74 by the parallel delay circuit travel in reverse direction. Thus reverse signals on a line 74 travel only to the coupler and from the coupler tap port to the RF main line input terminal for travel upstream in the coaxial cable distribution circuit.

I claim:

1. In a coaxial cable distribution system; a conducting housing and a lid therefor, a platform circuit board attached to said housing, said housing defining at least two ports for connection of a coaxial cable at each port, said platform board supporting a first extent of a radio frequency ('RF') path, between one of said ports and a first port terminal, and supporting a second extent of said RF path extending from a second path terminal to another of said ports, a coupler circuit board located between said platform board and a splitter board, a coupler circuit mounted on said coupler circuit board, said coupler circuit including, coupler main input and main output terminals, means for mechanically and electrically connecting each of said path terminals to a different one of said coupler main terminals, said coupler circuit including, a coupler output terminal, a splitter circuit board located adjacent said lid, a splitter circuit thereon including a splitter input and splitter output, an electrical connection between said coupler main output terminals and splitter input, said connection being spaced from said platform circuit board.

2. In a coaxial distribution circuit as claimed in claim 1 wherein said means for mechanically and electrically connecting each coupler board main terminal to either platform board terminal allows connection of a coupler board input terminal to either platform board output terminals.

3. In a coaxial cable distribution system as claimed in claim 1 including a platform ground plane on said platform board, a coupler ground plane on said coupler board connected to said platform ground plane and a splitter ground plane on said splitter board connected to said coupler ground plane.

4. In a coaxial cable distribution system as claimed in claim 3 wherein the connection between said coupler board ground plane and said platform ground plane is remote from the connection between said coupler board ground plane and said splitter board ground plane.

5. In a coaxial cable distribution system as claimed in claim 4 wherein said platform board ground plane is connected to said housing adjacent said one of said ports and said another of said ports wherein said splitter circuit has at least two output terminals and wherein said splitter ground is connected to said lid adjacent at least one of said splitter terminals.

6. In a coaxial cable distribution system as claimed in claim 3 wherein said platform board ground plane is connected to said housing adjacent said one of said ports and said another of said ports wherein said splitter circuit has at least two output terminals and wherein said splitter ground is connected to said lid adjacent at least one of said splitter terminals.

7. In a coaxial cable distribution system as claimed in claim 1 wherein said coupler includes circuitry for altering the relative strength of coupler RF output signals across a spectrum.

8. In a coaxial cable distribution housing having a lid, for closing said housing, a coupler board disposed in said housing to extend from a housing adjacent portion of the board to a lid-adjacent portion of the board, a coupler circuit supported on said coupler board, said coupler circuit being arranged to receive an input signal from a main RF path at said housing adjacent portion of the board and to provide an output signal over a direct connection from said lid-adjacent portion of the board to a splitter spaced from said main RF path.

9. In a coaxial cable distribution housing as claimed in claim 8 including a platform board mounted on said housing, and a splitter board mounted adjacent said lid, means for connecting an RF circuit on said platform board to said coupler circuit input, means remote from said platform board for connecting the input of a splitter circuit on said splitter board to said coupler output.

10. In combination:

a cable network distribution housing having opposed ends, a lid therefor, a platform board mounted on said housing, a splitter board mounted on said lid approximately parallel to said platform board and spaced thereform, a coupler board extending between said platform board and said splitter board, an RF circuit on said platform board, a coupler circuit on said coupler board, a splitter circuit on said splitter board, said coupler circuit having an input adjacent said platform board and an output adjacent said splitter board, said RF circuit being connected to said coupler input, said coupler output being directly connected to said splitter circuit.

11. In combination as claimed in claim 10, a ground plane for each of said platform, coupler and splitter boards, each of said ground planes acting to providing a ground current path which generally follows the circuit on the respective board, and provides an impedance with the circuit on the same board which approximates a characteristic impedance.

12. In combination as claimed in claim 11 wherein said coupler circuit is reversible relative to said RF circuit.

13. In a coaxial cable distribution system as claimed in claim 11 wherein said splitter circuit has at least one output connected to a splitter port, wherein said platform ground plane is connected to said housing adjacent each of said ends and said splitter ground plane is connected to said lid adjacent said-splitter port.

14. In combination as claimed in claim 10 wherein said coupler circuit is reversible relative to said RF circuit.

15. In a coaxial cable distribution system as claimed in claim 10 a coupler ground plane on said coupler board, and there are means to connect said coupler ground plane to a first conductor near said coupler input and spaced means for connecting said coupler ground plane to a second conductor near said coupler output.

16. In a coaxial cable distribution system as claimed in claim 15 wherein said platform board ground plane is connected to said housing.

17. In a coaxial cable distribution system as claimed in claim 10 a coupler ground plane on said coupler board, and there are means to connect said coupler ground plane to a first conductor near said coupler input and spaced means for connecting said coupler ground plane to a second conductor near said coupler output.

18. In a coaxial cable distribution system as claimed in claim 17 wherein said first conductor is a platform board ground plane and said second conductor is a splitter board ground plane.

19. In a coaxial cable distribution system as claimed in claim 10 wherein said coupler includes means for altering the relative strength of RF signals in a frequency spectrum between said coupler input and said coupler output with a coupler intermediate a main circuit and a splitter circuit so arranged that the coupler to splitter connection is remote from the main RF path so that the main path signals are less likely to affect the splitter signals.

20. For a coaxial cable distribution system, a housing and a lid therefor, a main RF path spaced from said lid, a splitter circuit adjacent said lid, a coupler circuit having an input with first and second connections spaced to include a portion of said main RF path, said first and second connections being located remote from said lid, said coupler circuit having a coupler output with a splitter connection to said splitter circuit, said coupler output and said splitter connection being located spaced from said first and second connections, wherein said coupler includes circuitry for modifying the relative strength of coupler RF output signals in a spectrum.

* * * * *